United States Patent [19]

Wilcox et al.

[11] Patent Number: 4,912,340
[45] Date of Patent: Mar. 27, 1990

[54] CIRCUIT FOR GENERATING NON-OVERLAPPING TWO-PHASE CLOCKS

[75] Inventors: Philip S. Wilcox; Stephen K. Sunter; Nayan Mehta, all of Nepean, Canada

[73] Assignee: Northern Telecom, Montreal, Canada

[21] Appl. No.: 260,942

[22] Filed: Oct. 21, 1988

[51] Int. Cl.$^4$ .......................... H03K 5/13; H03L 7/00
[52] U.S. Cl. .................................. 307/269; 307/262; 307/247.1; 307/480
[58] Field of Search ............... 307/262, 269, 265, 480, 307/272.1, 272.2, 271, 247.1; 328/63, 72

[56] References Cited

U.S. PATENT DOCUMENTS

| | | | |
|---|---|---|---|
| 3,612,906 | 10/1971 | Kennedy | 307/480 |
| 3,619,793 | 11/1971 | Broome | 307/480 |
| 4,758,737 | 7/1988 | Hirano | 307/262 |

OTHER PUBLICATIONS

"Design and Analysis of a Hierarchical Clock Distribution System of Synchronous Standard Cell/Macrocell VLSI, IEEE Journal of Solid-State Circuits", vol. S.C.-21, No. 2, Apr. 1986.

Primary Examiner—Stanley D. Miller
Assistant Examiner—Timothy P. Callahan
Attorney, Agent, or Firm—Thomas R. Morrison

[57] ABSTRACT

In order to provide for clocking master/slave flip-flops in complex circuits by means of non-overlapping two-phase clocks, a clock generator for providing two clocks signals for use with two-phase flip-flops, comprises a settable latch and a gating device. The settable latch has a data input connected to a reference source, a set input connected to receive one of the two clock signals and a clock input connected to receive the other of the two clock signals. The gating device has one input connected to receive such one of the two clock signals and a second input connected to the output of the settable latch. The output of the gating device, which corresponds to the other of the two clock signals, is connected to the clock input of the settable latch, the arrangement being such that when the settable latch has been set by a transition of the one clock signal resetting of the settable latch is enabled by the other clock signal. A digital circuit, for example an integrated circuit, may have a number of latches, each comprising, for example the first stage of a master/slave flip-flop, and such a clock generator for operating them. Preferably the latches are arranged in groups, conveniently as a macro sub-block, with a clock generator for operating each group. Preferably the settable latch is similar in construction to the latches being controlled.

22 Claims, 2 Drawing Sheets

CIRCUIT FOR GENERATING NON-OVERLAPPING TWO-PHASE CLOCKS

FIELD OF INVENTION

This invention relates to a clock generator for generating two-phase clocks, and a digital circuit including such a clock generator, and is especially applicable to clocks for use in complex integrated circuits.

BACKGROUND OF THE INVENTION

As integrated circuits, and systems employing groups of such circuits, become more complex it becomes desirable, if not imperative, to design testing facilities into them. One design process which has been developed to facilitate testing of an integrated circuit is the so-called "Scan Design", wherein each of the flip-flops (storage elements) in the integrated circuits has a multiplexer associated with it. This allows all of the flip-flops to be connected in series and "scanned", thus allowing one both to control and to observe all storage elements in the circuit. "Scan design" is most effective when the integrated circuit functions synchronously, i.e., all of the aforementioned flip-flops or storage elements are clocked by the same phase of one master clock. Unfortunately, with complex integrated circuits, it is difficult to achieve the reliable transfer of data between synchronously clocked storage elements when the time taken for the clock signal to reach one storage element from the clock source might be different from the time taken to reach another storage element. Because clock signals typically must be routed to all parts of the integrated circuit, and generally have high fan-out loading, they must often be re-buffered, perhaps several times, by a series of progressively larger buffers. Each buffer delays the signal by an amount which depends upon its load. Moreover, since different branches or paths will have different line resistances, a significant skew can result between the clock signals arriving at the remote storage elements. The delays introduced by re-buffering may lead to a so-called "race condition", wherein the data signal and the clock signal change at the same time.

Various approaches have been employed to ameliorate this problem of distributing clock signals in complex systems and integrated circuits. For example, Eby G. Friedman and Scott Powell discussed the problems of clock generation and distribution in such an environment in a paper entitled "Design and Analysis of a Hierarchical Clock Distribution System for Synchronous Standard Cell/Macrocell VLSI, IEEE Journal of Solid-State Circuits", Vol. S.C.-21, No. 2, April, 1986, which is incorporated herein by reference.

Robust two-edge timing can be achieved by inverting the clock signal to every second flip-flop in a data path, but this introduces considerable complication in the design of a circuit if it is to be testable by means of scan design.

Clocking schemes based on two-phase flip-flops can often provide robust timing but suffer from the disadvantage of requiring the generation of two clock phases and guaranteeing that their active levels are non-overlapping. One conventional method of generating a two-phase clock is to start with a double speed clock and divide it down to generate the non-overlapping pulses of the two clock signals. Disadvantages of this arrangement are the need for the higher speed clock and an additional control input to define the relative phase positions of the two phase clock signals. The amount of non-overlap is fixed at one-quarter of the clock period.

Another way of generating the two-phase clock signal is based upon the SR latch which involves a pair of NAND-gates one being clocked directly by the master clock and the other being clocked by the inverted master clock. The output of one NAND-gate is applied to the second input of the other, and vice versa. The outputs of the NAND-gates are also the respective two-phase clock signals. Although such an arrangement produces two phase clock signals which are non-overlapping, a disadvantage is that it is a minimum non-overlap at all edges. Such minimum non-overlap restricts the arrangement to localized areas of a design and also limits performance because the active following edge of the second clock signal is dependent upon the first clock signal and not directly upon the master clock. Moreover, the arrangement is not suited for communication between major blocks within an integrated circuit.

An object of the present invention is to mitigate these disadvantages.

BRIEF SUMMARY OF THE INVENTION

According to one aspect of the present invention, a clock generator, responsive to a single input or master clock signal for generating two clock signals for use with two-phase flip-flops, comprises settable latch means and gating means. The settable latch means has a data input connected to a reference source and, a set input connected to receive said input clock signal. The gating means has one input connected to receive said input clock signal and a second input connected to the output of said settable latch. The output of the gating means, which corresponds to said other of said two clock signals, is connected to the clock input of said settable latch, the arrangement being such that when the latch has been set by a transition of said input clock signal resetting of the settable latch is enabled by said other of said clock signals.

One of said two clock signals corresponds directly to the input or master clock, perhaps suitably buffered, and said other of said two clock signals corresponds to the output of said gating means.

The gating means may comprise a NAND gate. The settable latch means may comprise a D-type latch. Additional buffer means may be provided, with its input connected to the output of said gating means, the output of said additional buffer means comprising said other of said two clock signals.

According to a second aspect, the invention comprises a digital circuit comprising, in combination, a clock generator of the aforesaid first aspect and a number of latches operable by said other of said two clock signals, wherein each of said number of latches has a similar construction to that of said settable latch means of said clock generator.

An advantage of the latches being of similar construction is that they all will be affected to the same extent by environmental conditions e.g. temperature/voltage changes; process variations during manufacture.

In preferred embodiments each of said number of latches comprises one half of a master/slave flip-flop.

BRIEF DESCRIPTION OF THE DRAWINGS

An embodiment of the invention will now be described by way of example only, and with reference to the accompanying drawings, in which.

DETAILED DESCRIPTION OF A PREFERRED EMBODIMENT

Figure 1:
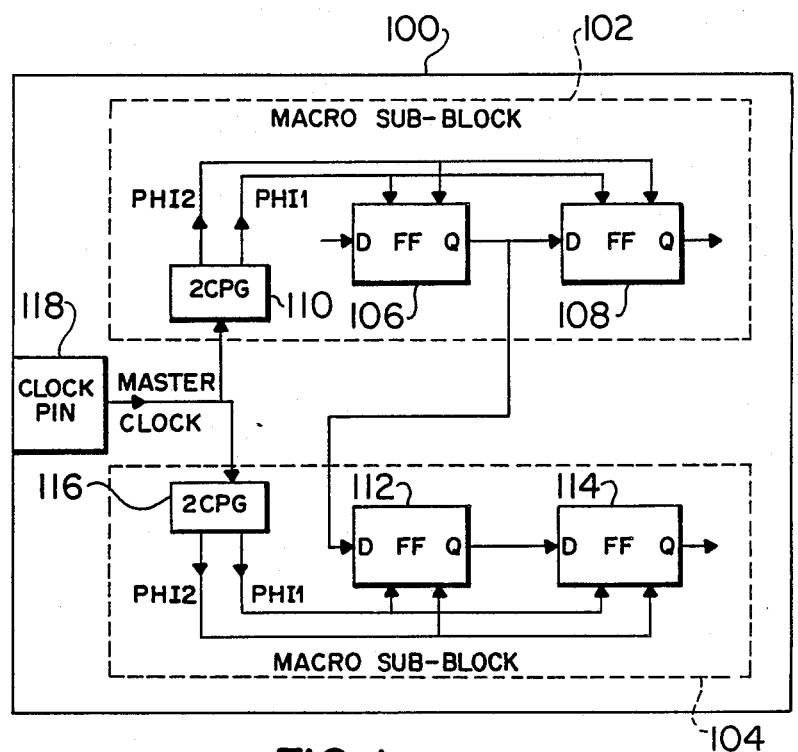
FIG. 1 is a schematic plan view, simplified, of an integrated circuit, embodying the invention.

Referring now to FIG. 1, an integrated circuit 100 comprises two macro sub-blocks 102 and 104, respectively, outlined by broken lines. These macro sub-blocks may comprise hundreds, even thousands of components but these are not shown in order to facilitate depiction of those parts of the circuit relative to the invention. Macro sub-block 102 comprises flip-flops 106 and 108, respectively, and a two-phase clock generator 110. Macro sub-block 104 comprises a similar pair of flip-flops 112 and 114, respectively, together with a two-phase clock generator 116. The two-phase clock generators 110 and 116, respectively, receive a common master clock signal by way of a clock pin 118. Each of the two-phase clock generators 110 and 116 provides two clock signals PHI1 and PHI2. Both clock signals PHI1 and PHI2 are applied to all of the flip-flops in the corresponding sub-macro. It should be appreciated that the flip-flops 106 and 108 are merely two in a chain of flip-flops. The way in which the flip-flops are interconnected is not relevant to the invention and will not be described in detail, except to note that a connection is shown between flip-flops 106 and 112, which reside in different sub-blocks clocked by different two-phase clock generators. Though much simplified, this diagram illustrates that the master clock is distributed to the various macro sub-blocks and drives a two-phase clock generator in each macro sub-block. It should be noted that there are no buffers between the outputs of the clock generators and the latches they operate.

In this example, the flip-flops are considered as active low, i.e. their inputs are sampled when PHI1 is low and their outputs are updated when PHI2 is low.

In order to generate two-phase clock signals a two-phase clock generator embodying the invention uses a settable latch, that is similar in construction to the master portion of the flip-flop to be clocked. This settable latch is connected such that the latching action defines the width of the PHI1 pulse and thus guarantees that the pulse will always be wide enough to capture the input data.

Figure 2:
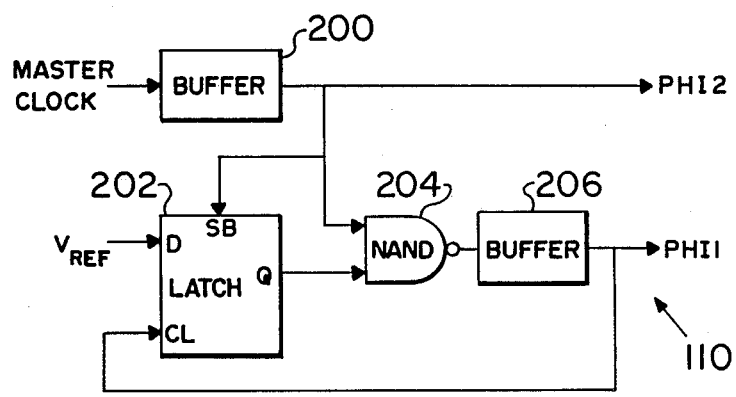
FIG. 2 is a detailed block diagram of a two-phase clock generator as employed in the circuit of FIG. 1.

The two-phase clock generator is shown in more detail in FIG. 2. Since both two-phase clock generators 110 and 116 are identical, only clock generator 110 will be described. Signals PHI1 and PHI2 must be suitably buffered to drive all the flip-flops in the block that this circuit is intended to serve. Thus, two-phase clock generator 110 comprises a buffer 200 to which the MASTER CLOCK signal is applied as an input clock signal. The output of buffer 200, designated PHI2, i.e. the buffered input or MASTER clock, is one of the two-phase clock signals provided at the output of the clock generator 110. The output of the buffer 200 is also applied, in common, to the "set-bar" input SB of a settable latch 202 and one input of a two-input NAND gate 204. The second input of the NAND gate 204 is connected to the Q output of settable latch 202 and the output of NAND gate 204 is applied to a second buffer 206. The output of the buffer 206, designated PHI1, constitutes the other of the two-phase clock signals and is also applied to the clock input of settable latch 202. The "D" input of settable latch 202 is connected to a reference $V_{ref}$, which is ground in this specific example but could be a controllable (user-defined) voltage instead, as will be discussed later.

Figure 3:
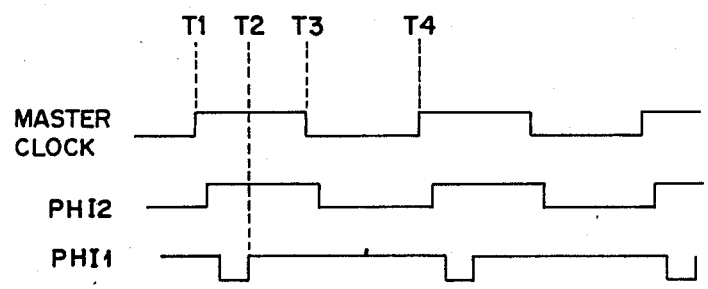
FIG. 3 is a timing diagram showing master and two-phase clock signals, in the circuit of FIG. 2.

Referring also to the timing diagrams in FIG. 3, in the quiescent state, the MASTER clock is low, the set-bar input SB of settable latch 202, is low, and its Q output is forced high together with one input of NAND gate 204. The other input of NAND gate 204 (PHI2) is low. The output of the NAND gate 204, and with it, signal PHI1, is high. Signal PHI1 applied to the clock input CL of the settable latch 202, sets it to "open" or non-transmitting.

When the Master CLOCK goes high (T1), the "other" input of the NAND gate 204 goes high. Since the Q output of the settable latch 202 reamins high (set-bar "inactive") the output of the NAND gate 204 will go low. Hence PHI1 goes low, giving a low or zero at the clock input CL of settable latch 202. The latter becomes transparent and, since the D input is grounded, the Q output becomes low. Consequently the output of the NAND gate goes high, together with the signal PHI1 (T2). The clock input Cl goes high, causing the settable latch to latch its Q output low. This state is held until the falling edge (T3) of the MASTER CLOCK sets the settable latch 202 and causes PHI2 to go low. The Q output of the settable latch 202 goes high, but this has no effect upon the output of the clock generator until the MASTER CLOCK goes high again (T4) and the cycle repeats. The width of the low-going pulse of PHI1 is sufficiently wide to ensure that the latch 202 can sample the signal $V_{ref}$ at its "D" input. The width of the "low" pulse in signal PHI1 may vary with process and operating conditions but will always be arranged to be at least the minimum required by the latch 202.

Figure 4:
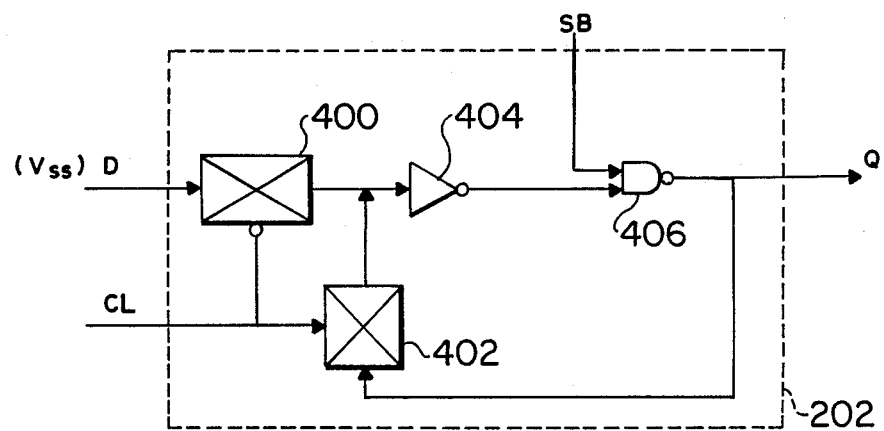
FIG. 4 is a detail block diagram of a settable latch as used in the circuit of FIG. 2.

As shown in more detail in FIG. 4, settable latch 202 comprises a complementary pair of transmission gates 400 and 402, conveniently fabricated using CMOS technology, an inverter gate 404 and a two-input NAND gate 406. The input of gate 400 comprises the "D" input of the latch 202 which is connected to reference $V_{ref}$. Its output is applied to the input of an inverter gate 404. The clock input CL of settable latch 202 is connected to an inverting input of gate 400 and one input of gate 402. The output of gate 402 also is connected to the input of inverter gate 404. The output of inverter gate 404 is connected to one input of NAND gate 406, and the SB (set-bar) input is connected to the other input of NAND gate 406. The output of NAND gate 406 is the Q output of settable latch 202, which is also connected to an input of gate 402.

The transmission gates 400 and 402, respectively, operate as a complementary switch to select either the input signal or the feedback signal for application to the input of inverter gate 404. The NAND gate 406 permits setting of the latch by means of the "set" signal SB.

As mentioned previously, the two phase clock signal PHI2 is directly buffered from the single phase system clock. Since outputs are generated from PHI2 this provides for minimum possible device propagation delays. The key feature is that PHI1 is a very narrow pulse, just wide enough to ensure the master latches in the macro sub-block can capture the input data. Slew tolerance is provided by the fact that the rising edge of PHI1 is well spaced (at substantially the maximum possible) from the falling edge of PHI2. The relatively small non-overlap between PHI2 rising and PHI1 falling is not critical because the effect of those two edges is felt only at the interface of the master and slave sections. This interface is buried within the flip-flop and is therefore well defined and always a constant. In the low frequency limit the above timing reduces to the equivalent of single-phase two-edge, the most robust of timing methods. The maximum propagation delay allowed is approximately one half of a clock period, from the falling edge of PHI2 to the rising edge of PHI1. In the high frequency limit, where the width of the PHI1 pulse width becomes comparable to one half of the clock period, the performance becomes equivalent to single-phase single-edge timing.

In a typical integrated circuit, the single phase input clock MASTER CLOCK would be routed to all of the macro sub-blocks within the integrated circuit. This is a simple and efficient clock distribution method. Within a sub-block, a two-phase clock generator circuit as described would be used to generate the local two-phase clocks. There will, of course, be some skew between the PHI1/PHI2 signals in different sub-blocks. Tolerance for such skew is achieved by the margins between the falling of signal PHI2 in any one block and the rising of signal PHI1 in any other block.

Generation of the two-phase clock signal PHI1 as a pulse in this way ensures maximum skew tolerance between or within sub-blocks. Propagation delays are defined by the edge of the PHI2 two-phase clock signal. Because there is only the buffer 200 between the MASTER clock and the two-phase clock signal PHI2, minimum propagation delays can be achieved.

Although this description shows a two-phase clock generator being provided on each macro sub-block of an integrated circuit, it should be appreciated that the macro sub-blocks need not be on the same integrated circuit. Indeed, the macro sub-blocks could themselves be individual integrated circuits in a larger system. For example, a circuit board carrying an array of integrated circuits could have a common single phase master clock supplying the whole of the printed circuit board and the array of integrated circuits, with each integrated circuit generating the two phase clocks for distribution within its own circuit.

Figure 5:
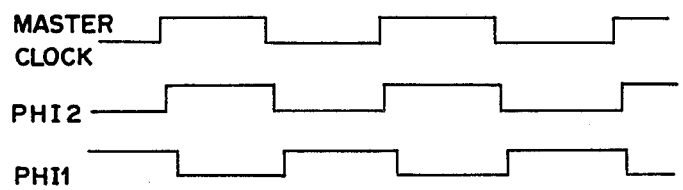
FIG. 5 is a timing diagram illustrating modified operation of the two-phase clock generator shown in FIG. 2.

As mentioned previously, the reference $V_{ref}$ need not be permanently ground, as described, but may be a user-controllable signal. With $V_{ref}$ low, the clock circuit would operate as previously described. With $V_{ref}$ high, however, the two-phase clock generator 110 would operate in a slightly different manner. In effect, the settable latch 202 would be disabled and would not affect the signal PHI1. As depicted in the modified timing diagram in FIG. 5, clock signal PHI1 thus would become the pure complement of clock signal PHI2. Although these signals would not be non-overlapping, they could still be used to clock two-phase flip-flops.

This arrangement could be useful for very high frequency operation since it would provide the equivalent of single phase or single-edge timing. For scan testing, a lower frequency could be used in the non-overlapping timing mode. The cell design degenerates to equivalent single phase operation at high frequencies where the PHI1 pulse width would become equal to one half of a clock period.

Various modifications are possible without departing from the scope of the invention. For example, a NOR gate could be substituted for the NAND gate 204 with appropriate inversion of the signals applied to it. Moreover, although active-low flip-flops are specifically described, active-high flip-flops could be substituted, latch 202 being chosen to operate on high clock pulses. Likewise, other types of latch might be used in place of the D-type latch described. For example, the transmission gates could be omitted. Also buffer means may be added in the feedback loop between the output of buffer 206 and the clock input CL of latch 202 to lengthen the PHI1 pulse.

Embodiments of the invention provide for the generation of two-phase clocks with the skew margin of a one-phase two-edge system and minimal propagation delays. A particularly advantageous feature is the very narrow "sampling" pulse width of the PHI1 clock, the phase used on the input or master stage of a master/slave flip-flop. This narrow pulse is generated in a feedback loop using the same circuit as in the master stage of the master/slave flip-flop. This design guarantees the pulse will be wide enough yet will always be the minimum required over all operating conditions. A further advantage of this arrangement is that, as fan-out increases the load at the output of buffer 206, the falling of signal PHI1 will be retarded, causing a lengthening of the PHI1 pulse.

We claim:

1. A clock generator, for providing two clock signals, phase-displaced relative to each other, from a single input clock signal, comprising settable latch means, gating means, and an output for supplying said input clock signal as one of said two clock signals, said settable latch means having a data input connected to a reference source, and a set input connected to receive said input clock signal, said gating means having one input connected to receive said input clock signal a second input connected to the output of said settable latch, and its output connected to the clock input of said settable latch, the arrangement being such that when the settable latch means has been set by a transition of said input clock signal resetting of said settable latch means is enabled by said other of said two clock signals.

2. A clock generator as defined in claim 1, wherein said settable latch means comprises a D-type latch.

3. A clock generator as defined in claim 1, wherein said gating means comprises a NAND gate.

4. A clock generator as defined in claim 1, further comprising buffer means having its input arranged to receive said input clock signal, the output of such buffer means being applied to said set input of said settable latch and constituting said one of said two clock signals.

5. A clock generator as defined in claim 1, further comprising buffer means having its input connected to the output of said gating means, the output of said buffer means comprising said other of said two clock signals.

6. A digital circuit comprising, in combination, a clock generator for providing two clock signals, one displaced relative to the other, from a single input clock signal, and a number of latches operable by one of said two clock signals, said clock generator comprising settable latch means and gating means, said settable latch means having a data input connected to a reference, and a set input connected to receive said input clock signal, said gating means having one input connected to receive said input clock signal, a second input connected to the output of said settable latch, and its output connected to the clock input of the settable latch, the arrangement being such that when said settable latch means has been set by a transition of said input clock signal, resetting of said settable latch means is enabled by said other of said two clock signals, each of said number of latches being of similar construction to said settable latch means in said clock generator.

7. A digital circuit as defined in claim 6, wherein said number of latches comprise one of a plurality of groups of latches, there being a said clock generator for each said group.

8. A digital circuit as defined in claim 7, wherein each said group of latches is fabricated in a macro sub-block of an integrated circuit.

9. A digital circuit as defined in claim 6, wherein each of said number of latches comprises one half of a master/slave flip-flop, the other half of said flip-flop being controlled by said other of said two clock signals.

10. A digital circuit as defined in claim 9, wherein said settable latch means comprises a D-type latch.

11. A digital circuit as defined in claim 6, wherein said gating means comprises a NAND gate.

12. A digital circuit as defined in claim 6, further comprising buffer means having its input arranged to receive said input clock signal, the output of such buffer means being applied to said set input of said settable latch and constituting said one of said two clock signals.

13. A digital circuit as defined in claim 6, further comprising buffer means having its input connected to the output of said gating means, the output of said buffer means comprising said other of said two clock signals.

14. A digital circuit as defined in claim 7, wherein each of said number of latches comprises one half of a master/slave flip-flop, the other half of said flip-flop being controlled by said other of said two clock signals.

15. A digital circuit as defined in claim 8, wherein each of said number of latches comprises one half of a master/slave flip-flop, the other half of said flip-flop being controlled by said other of said two clock signals.

16. A digital circuit as defined in claim 7, wherein said gating means comprises a NAND gate.

17. A digital circuit as defined in claim 8, wherein said gating means comprises a NAND gate.

18. A digital circuit as defined in claim 7, further comprising buffer means having its input arranged to receive said master clock, the output of such buffer means constituting said one of said two clock signals.

19. A digital circuit as defined in claim 8, further comprising means having its input arranged to receive said master clock, the output of such buffer means constituting said one of said two clock signals.

20. A digital circuit as defined in claim 7, further comprising buffer means having its input connected to the output of said gating means, the output of said buffer means comprising said other of said two clock signals.

21. A digital circuit as defined in claim 8, further comprising buffer means having its input connected to the output of said gating means, the output of said buffer means comprising said other of said two clock signals.

22. A clock generator as defined in claim 2, wherein said gating means comprises a NAND gate.

* * * * *